INVENTOR
ROBERT V. SAMUELIAN

BY Stowell & Stowell

ATTORNEYS

INVENTOR
ROBERT V. SAMUELIAN

BY Stowell & Stowell

ATTORNEYS

United States Patent Office 3,230,433
Patented Jan. 18, 1966

3,230,433
QUADRATURE REJECTOR FOR FUEL GAUGES

Robert V. Samuelian, Scarsdale, N.Y., assignor to Simmonds Precision Products, Inc., Tarrytown, N.Y., a corporation of New York Filed June 12, 1962, Ser. No. 201,987
7 Claims. (Cl. 318—28)

The present invention relates to control circuits for gauging fuel in tanks, and has more particular reference to gauging fuels with conductive anti-static additives such as used in jet fuels stored in tanks, to reduce the susceptibility to conductive or quadrature currents.

Essentially the invention pertains to an arrangement in which a quadrature rejector senses the amount of quadrature signal at a servo amplifier output and feeds back an out-of-phase quadrature signal to the amplified input which tends to cancel the quadrature current that may be present. The amplifier gain for quadrature signals has been reduced because of negative feedback through the quadrature rejector. In order to operate a circuit for rejecting an amount of quadrature signal at the amplifier output, and for feeding back a negative signal to cancel the quadrature current that is present, the amplifier output is used to provide utility in the gauging equipment. The feedback circuit of the invention includes a phase sensitive detector and a remodulator, as well as other essential circuit components which are described hereinbelow.

It is, therefore, an object of the present invention that a circuit be provided to aid the gauging of fuel, such as jet fuels, that contain conductive anti-static additives. These additives are known to increase the dissipation factor of the fuel considerably and cause large quadrature currents which saturate the amplifiers in capacitance type gauges. By use of the circuit of the invention there is provided a low cost quadrature current rejector useful with capacitance type gauges in which the amplifiers are not saturated as would ordinarily be contemplated.

It is another feature of the invention to provide a rejector circuit which senses the amount of quadrature signal at the amplifier output and feeds back an out-of-phase quadrature signal to the amplifier input which tends to cancel the quadrature current that is present.

It is another object of the invention to provide an amplifier gain circuit for quadrature signals in which the gain is reduced by negative feedback through the quadrature rejector.

Figure 1A:
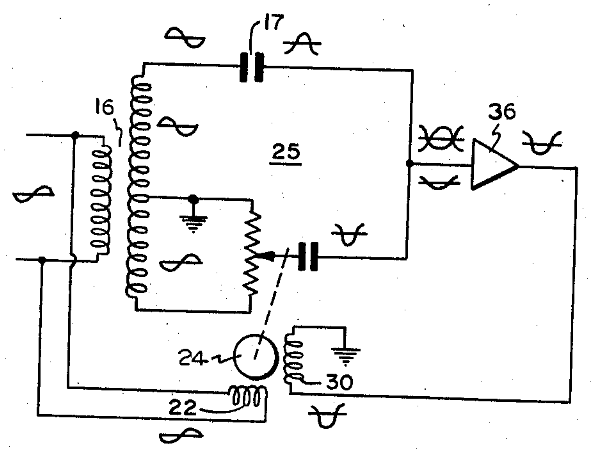
Figure 1B:
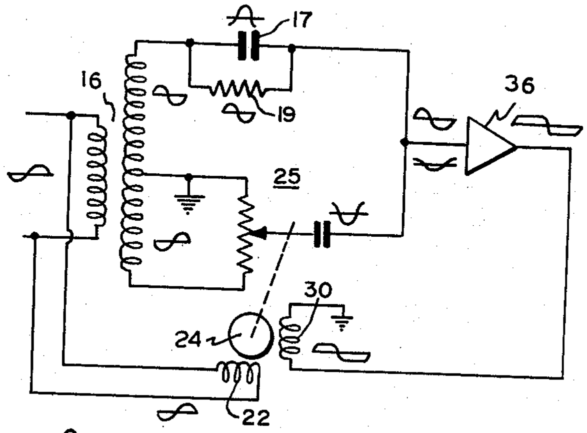
Figure 1C:
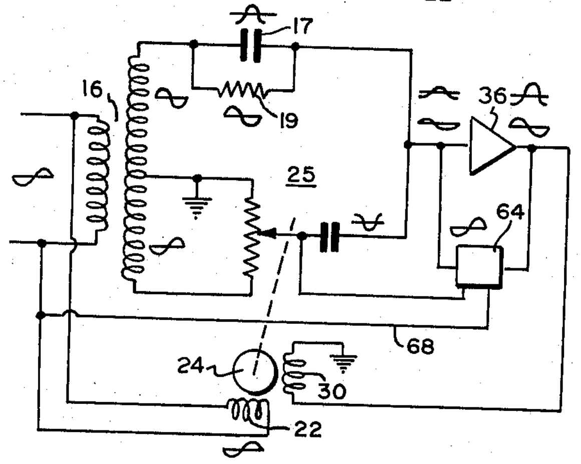
Figure 2:
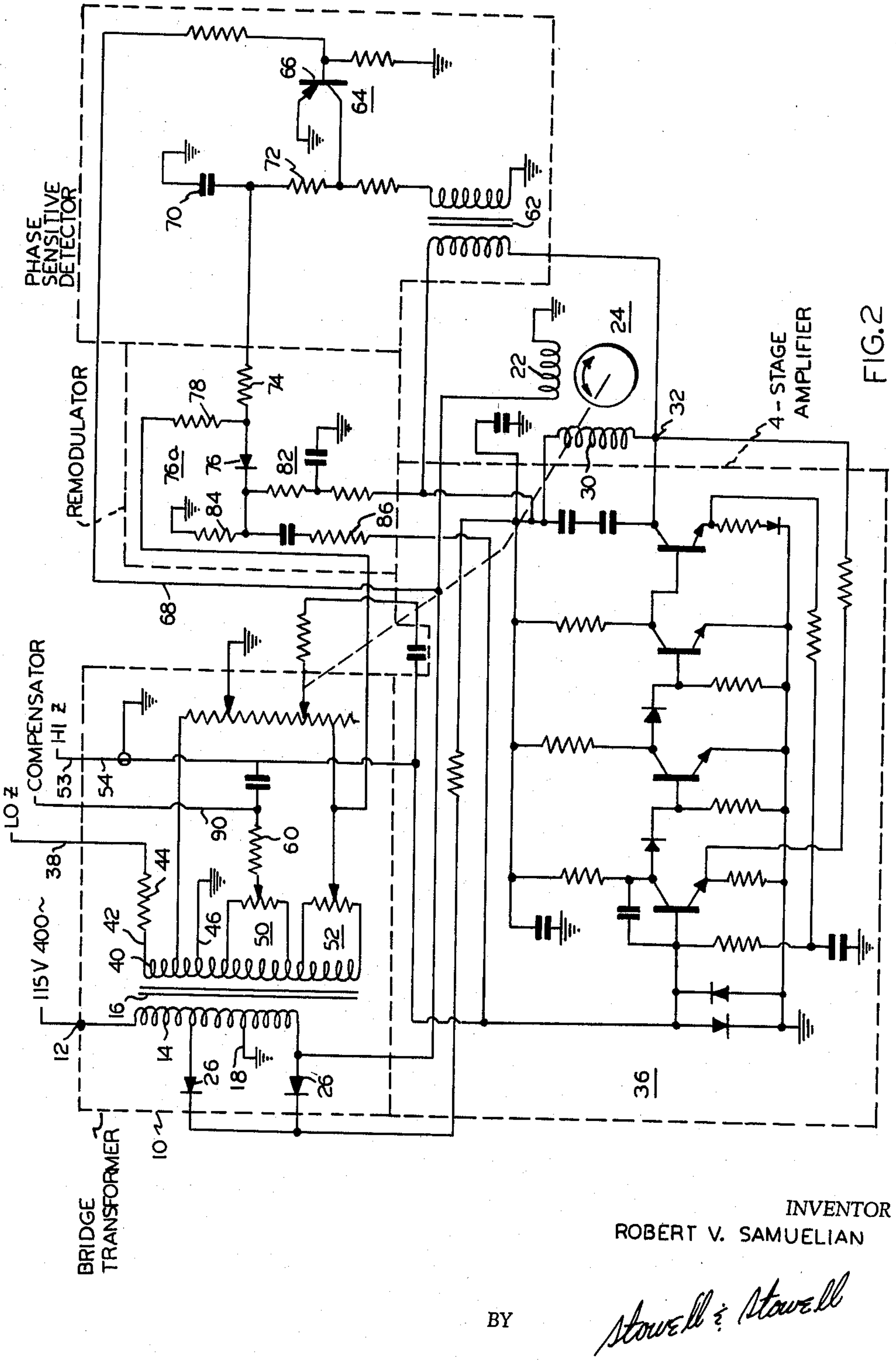

Other objects and advantages will be apparent from a detailed description of the invention and from the appended drawings and claims. The invention will now be described in detail in connection with the accompanying drawings in which:

FIG. 1*a* is a schematic circuit diagram of a standard prior art fuel gauge with capacitance type gauge having a low dissipation value;

FIG. 1*b* is a circuit diagram of a fuel gauge with higher dissipation characteristics which engender quadrature components therein;

FIG. 1*c* is a circuit diagram showing an arrangement for a gauge measuring fuels having a high dissipation factor in which the quadrature component is rejected in accordance with the concept of the present invention; and FIG. 2 is a circuit diagram of a fuel gauge including a quadrature rejector component unit in accordance with the preferred embodiment of the present invention.

Referring now to the drawing, FIG. 1*a* shows a schematic diagram of a typical fuel gauge measuring fuel having a low dissipation factor, FIG. 1*b* of a standard fuel gauge for measuring fuel having a high dissipation factor which develops quadrature components in the output of the associated amplifier by the addition of a resistance 19. There is illustrated in FIG. 1*a* a fuel gauge system having a tank impedance or condenser 17 which is to be immersed in a fuel tank (not shown) so that the fuel that may be in the tank affects the impedance value of the condenser. The value of the condenser is chosen so that it varies as a function of the fuel level when the level coincides with some part of the condenser. The capacitance varies either as a function of the fuel level or as a function of the dielectric constant of the fuel. FIGS. 1*a* and 1*b* show a conventional self-balancing servo system which operates in response to changes in the capacitance of element 17 as the level or content of the fuel changes to produce a signal to rotate motor 24 to rebalance the system and also to indicate by its position the quantity being measured. However, when the fuel contains anti-static additives, these additives form in an electric circuit what is effectively a resistive shunt across the measuring capacitor 17, and which shunt is shown diagrammatically in FIG. 1*b* as a resistor 19. The effect of the additives thus providing a shunt path across the condenser is to introduce an undesired component in quadrature with the signal supplied by capacitor 17 to the input of amplifier 36. The changes in the element 17 are from time to time, and are due primarly to a change in the level or dielectric constant of the fuel or due to any other condition being measured.

The problem of gauging oil in an aircraft with capacitive type liquid level systems is considerable since oils frequently tend to have high dissipation factors which change with temperature and with different kind of additives used by the various manufacturers. When gauging most aircraft fuels the dissipation factor is low and the electrical resistance between the plates of the capacitor is extremely high so that the current flowing through the sensing leg of a standard capacitive bridge circuit is essentially completely capacitive. In gauging oils however, where the dissipation factor is high there is in effect a finite resistance existing between the plates of the measuring capacitor which produces a resistive path for current between the plates of the capacitor. The effect of placing this resistance in parallel with the capacitive sensor is to produce a phase shift in the current flowing therethrough different from that which would be seen in a purely capacitive path.

In many fuel gauge systems an amplifier is connected to the sensing capacitive arm of the bridge and provides an output signal to the control winding of a motor. The line winding of the motor has impressed across it a voltage of a phase in quadrature with the voltage impressed across the control winding by the amplifier. When a resistive path is placed across the sensing capacitor and the normal phase of the current therethrough shifts, it is seen that the phase of the voltage at the output of the amplifier is no longer in quadrature with the voltage across the line winding of the motor. Since only the component in the control winding which is 90 degress out of phase with the line winding of that motor is effective to cause rotation of the motor, the motor generally becomes sluggish and unresponsive. This problem is quite serious with large changes in phase angle.

In the various schematic diagrams shown in FIGS. 1*a* to 1*c* and in FIG. 2, the theoretical approach being presented is that the tank impedance 17 shifts the phase of the signal produced by a 90° value, but actually, in the presence of additives and with empirical results, the value of the quadrature component through the resistive element 19 is not quite a quadrature but is small, although yet a significant component compared with the desired component passed by condenser 17. The purpose of the quadrature rejection circuits of FIGS. 1*c* and 2 is to compensate for the current component passed by the resistance path through resistance 19. In referring to the overall mode of operation of FIG. 2, the capacitive element is connected directly between the LOZ and HIZ terminals shown in FIG. 2, and the amplifier 36 of FIGS. 1*a* to 1*c* is shown as a 4-stage transistor amplifier. The input to amplifier 36 would thus be the algebraic sum of the command signal on lead 54 from a measuring condenser such as 17 and including a quadrature component, a feedback voltage from the potentiometer whose tap is positioned by the motor, and a voltage from 86 which is 180° out of phase with and thus cancels the quadrature component of the command voltage on lead 54.

FIG. 1*c* shows a quadrature rejector arrangement according to the invention, and FIG. 2 more particularly discloses the circuit components of the fuel gauge system incorporating the quadrature rejector arrangement of the present invention as described hereinbelow. In FIG. 1*a*, an A.C. source is applied to the primary of transformer 16 and also is applied to a field winding 27 of motor 24. From the secondary winding of transformer 16 are derived out-of-phase signals with respect to a center tap ground connection thereof and these out-of-phase signals are compared at an input terminal of the amplifier 36. The respective wave forms of the out-of-phase signals are shown. One of the two out-of-phase signals is seen to be adjustable through a potentiometer 25 driven by the armature 2 of the reversible motor 24. The amplifier 36 provides an output to compare with the current of the source in winding 22 and the relationship of these currents in windings 22 and 30 drives the tap of the potentionmeter to reset the input signal values of the amplifier to a corrected one. As the value of tank capacitance or impedance 17 changes from time to time, it is appreciated that the input signal values of the amplifier 36 are corrected.

In FIG. 1*b*, the tank impedance is schematically shown as having a high dissipation value and produces the attending wave forms showing that the phase of the signal developed through the tank impedance 17 is shifted in phase by an exemplary 90° value, which is the quadrature component. From this quadrature component, the amplifier produces a rectified component in its output, and this is applied to motor 24 to achieve compensated control of the motor in adjusting the potentiometer.

The circuit of FIG. 1*b* has the disadvantage of the quadrature current affecting the motor and the operation of positioning the potentiometer resulting from the phase shift developed by the characteristic of the tank impedance, schematically shown by elements 17, 19. This current applied to the amplifier 36 is the quadrature current. To eliminate these disadvantageous effects of the quadrature current, a phase-sensitive detector 64, as provided in FIG. 1*c*, is coupled to the amplifier output to feed back a signal to the amplifier as shown in FIG. 1*c*. The phase sensitive detector reduces the susceptibility of conductive or quadrature currents resulting from the effect of adding conductive anti-static additives to fuel in tanks used on jet aircraft. This conductive feature produces the phase shift in the current applied to the amplifier 36 from capacitive gauging means, and the conductive path through the impedance of the fuel is characterized in the impedance 19.

In FIG. 1*c* the phase sensitive detector 64 senses the phase of the quadrature signal by comparison with the phase of the source applied to the transformer, since conductor 68 is shown connected to a terminal of the primary winding of transformer 16. The resultant phase signal is an out-of-phase quadrature phase signal and is fed to the input of the amplifier for tending to oppose or cancel out the quadrature current that is found to be present at the amplifier input and which current is received from the fuel tank elements 17, 19. FIG. 1*c* shows the feedback loop from the right side of the amplifier through the phase sensitive detector 64 to the input or left side of the amplifier 36. In this arrangement, the phase sensitive detector derives a signal negative in character to the quadrature signal to oppose or cancel out the quadrature signal found to be present at the amplifier input. The essential features of the phase sensitive detector and the overall circuit elements conconsidered pertinent to the operation of the invention are seen in FIG. 2 described below.

As intended to be apparent from the drawings, FIG. 2 shows the circuit units of FIG. 1*c* in essentially dotted line grouping of the circuit components. The relationship of FIG. 1*c* is a block diagram of that schematically shown in FIG. 2.

FIG. 2 shows a bridge impedance network 10 having an input applied at terminal 12 to which may be applied a 115 volt, 400 cycle supply current. Terminal 12 is connected to a primary winding 14 of transformer 16, and the primary is shown connected to ground at 18. The remote end of the primary winding 14 furnishes a sine wave output that is applied to winding 22 of motor 24, the winding 22 having its remote end also connected to ground as shown.

Rectifiers 26, 26 supply full wave rectification of the primary winding 14 to winding 30 of motor 24 which is thence connected to a servo amplifier output terminal 32 of a 4-stage amplifier 36. The full wave output of the primary winding 14 is further applied to energize the collector side of the transistors forming the 4-stage amplifier 36.

The transformer 16 has a secondary winding 40 connected so that a low impedance input 38 is connected to a terminal end 42 thereof through an impedance element 44, and a turn 46 of the secondary winding 40 is connected to ground. Further turns of the secondary winding 40 are shown to comprise an "empty tank" adjustment potentiometer circuit 50 and a "full tank" adjustment potentiometer circuit 52.

A high impedance connection 53 from a low dissipation factor fluid gauging apparatus (not shown) is connected to shielded line 54 having its shielding connected to ground as is schematically shown. The center conductor of the shielded line 54 is connected to the "empty tank" adjustment circuit 50 through impedance network 60, and the line 54 is further connected to the input of the 4-stage amplifier 36. The amplifier output signal from output terminal 32 is applied through a transformer 62 to a half wave transistor phase sensitive detector 64. The transistor 66 of the sensitive detector 64 is driven ON and OFF by a reference from the bridge impedance network 10 applied over conductor 68 connected from the primary side winding of the transformer. The reference signal on the conductor 68 is in phase with the quadrature signal at the output terminal 32 of the amplifier. Due to the phasing relationship, only the positive half cycles of the quadrature signal are applied to the capacitor 70 of a filter network consisting of a capacitor 70 and a resistor 72. The negative half cycles of the quadrature signal are shorted to ground by the transistor 66.

It is noted that the in-phase motor driving signal applied to the winding 30 is not detected because its average value at the collector of transistor 66 is zero. Therefore, the D.C. voltage of the filter network 70, 72 will be proportional to only the quadrature signal present at the amplifier output terminal 32. This quadrature voltage signal at terminal 32 varies from zero with no quadrature signal to about one volt with a large quadrature signal.

A small A.C. voltage in the order of 0.1 volt R.M.S. from the full adjustment potentiometer circuit of the bridge impedance network 10 is applied to the junction of a resistor 74, and a diode 76 through a resistor 78. The phase of this voltage as applied from the full adjustment potentiometer circuit 52 is such that it is 180° out of phase with the quadrature current present at the input of the 4-stage amplifier 36. The diode 76 is normally biased with a 0.3 volt D.C. current applied from the full wave output of the primary winding 14 of the bridge impedance network as applied through the resistance capacitance network 82. With this arrangement diode 76 is normally not conducting. However, as the voltage on capacitance 70 tends to increase from zero due to increasing quadrature current applied to the 4-stage amplifier 36, diode 76 is gradually turned ON. This action of the diode allows the A.C. voltage to gradually appear across resistor 84. The voltage drop of resistance 84 is an out-of-phase quadrature signal and is applied to resistor 86 which is then applied to the input of the 4-stage amplifier 36 where it primarily cancels the quadrature input that is present therein.

By the action of the phase sensitive detector 64 and the diode action of remodulator 76a the quadrature output of the 4-stage amplifier is cancelled or rejected so that the value of quadrature input that may be now applied to the 4-stage amplifier before it saturates is increased 13 to 1 over that previously allowed. This corresponds to a maximum quadrature input current of 2 microamperes, and may provide a corresponding increase of value to a maximum dissipation factor of 0.2 where the dissipation factor is defined as $1/\omega$ RC. The dissipation factor of anti-static additives, which are generally of the conductive type, generally have a high dissipation factor measured at 0.08 or 0.09.

Thus, it is apparent that by the use of the phase sensitive detector 64 and the remodulator 76a to provide a quadrature current rejector circuit arrangement using substantially low cost components, a circuit is provided that rejects a quadrature current that is in phase with the low impedance voltage. However, the rejector may also be used in a compensated system, since the leakage current from the tank unit (not shown) will always be greater than the leakage current from the compensator means connected to line 90. This means that the net quadrature current applied to the input of the amplifier 36 will always be in phase with the low impedance voltage applied over conductor 42, regardless of the system arrangement. No changes will be required to the rejector for use in a compensated system.

It may be necessary to change or adjust the component value of the resistor 78 to set the maximum quadrature current which the rejector will reject. It has been found that the rejector circuit comprising the detector 64 and the remodulator 76a functions substantially satisfactorily with maximum quadrature input currents up to 3 microamperes.

In those circuit arrangements where 3-stage amplifiers are provided instead of a 4-stage amplifier 36, it is necessary merely to reverse the connections of the primary of the transformer 62 or the connections of the primary winding 14 of the transformer 16.

It has been found that the quadrature rejector arrangement of the invention is substantially effective over a temperature range of from —55° C. to +110° C. over a voltage range from 105 to 125 v. R.M.S, and over a frequency range of from 360 to 440 cycles per second. With a quadrature input of up to 1 microampere, the scale error over the above-mentioned ranges in no case execeds generally 0.1% of full scale. Above the 1 microampere input, the scale error increases generally to a maximum of 0.5% at 1.8 microamperes. However, with present anti-static additives, the maximum input current should be in the order of 0.8 microampere so that the error caused by this quadrature current input of the amplifier 36 should be less than 0.1%.

It will thus be apparent that the new circuit apparatus provides a low cost quadrature rejector circuit arrangement that may be added to many conventional fuel gauges of the capacitance type to reduce the susceptibility to conductive or quadrature currents. The quadrature phase sensitive detector 64 and remodulator 76a sense the amount of quadrature signal at the servo amplifier output terminal 32 and feeds back an out-of-phase quadrature signal to the input of the amplifier 36 which tends to cancel the quadrature current present therein.

One of the more specific advantages of the apparatus resides in reducing the amplifier gain for quadrature signals by negative feed back through the quadrature rejector.

Additional embodiments of the invention in this specification will occur to others and therefore it is intended that the scope of the invention be limited only by the appended claims and not by the embodiment described hereinabove. Accordingly, reference should be made to the following claims in determining the full scope of the invention.

What is claimed is:

1. A gauging circuit comprising a bridge impedance network for providing an output signal indication of an unbalanced condition of said network, said signal including a desired component and an undesired quadrature component, a multi-stage amplifier having an input terminal and an output terminal, a connection to said input terminal from a point on said bridge impedance network, a motor having a control winding to which the output signal from said amplifier is supplied and a reference winding, and means operated by said motor to rebalance said bridge network, a phase sensitive detection circuit connected to the output terminal for detecting the presence of a quadrature, a filter network to pass positive signal corresponding to the detected quadrature component, a diode network normally biased to a non-conductive state, means for applying to the diode network the output of the filter network so that the diode network conducts on increases of said quadrature component as detected in the phase sensitive detection circuit, and impedance means to apply the out-of-phase output of the diode network to the input terminal of the amplifier.

2. A gauging circuit comprising a bridge impedance network for providing an output signal indication of an unbalanced condition of said network, said signal including a desired component and an undesired quadrature component, a multi-stage amplifier having an input terminal and an output terminal, a connection to said input terminal from a point on said bridge impedance network, a motor having a control winding to which the output signal from said amplifier is supplied and a reference winding, and means operated by said motor to rebalance said bridge network, means for applying a periodic signal from a high impedance circuit to the input terminal of the amplifier, a phase detector circuit connected to the output terminal for detecting from the periodic signals the presence of the phase component thereof as a quadrature relation with respect to the phase at another point on said network, a filter network to pass the positive cycles of the detected phases of the phase quadrature component and a diode network normally biased to a non-conductive state, means for applying to the diode network the output of the filter network so that the diode network conducts in increased measure as the detected phase quadrature components increase.

3. A gauging circuit comprising a bridge network for providing an output signal indication of an unbalanced condition of said network, said signal including a desired component and an undesired quadrature component, a multi-stage servo amplifier having an input terminal and an output terminal, a connection to said input terminal from a point on said bridge impedance network, a motor having a control winding to which the output signal from said amplifier is supplied and a reference winding, and means operated by said motor to rebalance said bridge network, means for applying a signal from an impedance circuit to the input terminal of the servo amplifier, a phase detection circuit connected to the servo amplifier output terminal for detecting the presence of the quadrature component, a filter network to pass the positive cycles of the detected signal, a diode network normally biased to a non-conductive state, means for applying to the diode network the output signal of the filter network so that the diode network conducts as the quadrature relation signal increases and is applied to the phase detection circuit and impedance means included in said servo amplifier to apply the out-of-phase signal output of the diode network to the input terminal of the servo amplifier.

4. A gauging circuit comprising a bridge network for providing an output signal indication of an unbalanced condition of said network, said signal including a desired component and an undesired quadrature component, and including a transformer having a primary side and a secondary side, an amplifier having an input terminal and an output terminal, a connection to said input terminal from a point on said bridge impedance network, a motor having a control winding to which the output signal from said amplifier is supplied and a reference winding, and means operated by said motor to rebalance said bridge network, means for applying a signal from either a high or low impedance circuit to the input terminal of the amplifier, a phase detector circuit connected to the output terminal for detecting the presence of the phase component of the quadrature signal in relation with respect to the phase at the primary side of the transformer, a filter network to pass the positive portions of the deteced quadraure signal, a diode network normally biased to a non-conductive state, and means for applying to the diode network the output signal of the filter network so that the diode network conducts in increased measure as the quadrature signal increases.

5. A gauging circuit comprising a bridge network for providing an output signal indication of an unbalanced condition of said network, said signal including a desired component and an undesired quadrature component, and including a transformer having a primary side and a secondary side, a multi-stage amplifier having an input terminal and an output terminal, a connection to said input terminal from a point on said bridge impedance network, a motor having a control winding to which the output signal from said amplifier is supplied and a reference winding, and means operated by said motor to rebalance said bridge network, a phase detection circuit connected to the output terminal for detecting the presence of the phase component of the quadrature signal with respect to the phase of the current at the primary side of the transformer, a filter network to pass the positive cycles of the detected phase signal, a diode network normally biased to a non-conductive state, means for applying to the diode network the output signal of the filter network in a polarity relation so that the diode network conducts as the magnitude of the quadrature signal increases, and impedance means to apply the out-of-phase output signal of the diode network derived as a result of the in circuit connection of the other impedance network to the input terminal of the amplifier to derive from the output terminal a signal in or out-of-phase relation to the input signal when one of said impedance circuits is applied and to derive a quadrature signal when the other impedance circuit is applied thereto, a phase detector circuit connected to the output terminal for detecting the presence of the phase component of the quadrature signal, a filter network to pass the positive portion of the detected quadrature signal, a diode network normally biased to a non-conductive state and means for applying to the diode network the output signal of the filter network so that the diode network conducts in proportion to the quadrature signal detected by the phase detector circuit.

6. A gauging circuit comprising a network for providing an output signal indication of an unbalanced condition of said network, said signal including a desired component and an undesired quadrature component, and including a primary impedance side and a secondary impedance side, a multistage amplifier having an input terminal and an output terminal, a connection to said input terminal from a point on said bridge impedance network, a motor having a control winding to which the output signal from said amplifier is supplied and a reference winding, and means operated by said motor to rebalance said bridge network, means for applying a signal from impedance circuits to the input terminal of the amplifier, a phase detection circuit connected to the output terminal of the amplifier for detecting the presence of a phase component as a quadrature signal shifted in phase relation to the input signal applied to the amplifier, a demodulator network including a filter network to pass the positive portion of the detected quadrature signal, said demodulator further including a diode network normally biased to a non-conductive state, means for applying to the diode network the output signal of the filter network so that the diode network conducts in response to detection of the quadrature signal, means to apply the out-of-phase output signal of the diode network to the input terminal of the amplifier.

7. A gauging circut comprising a bridge network for providing an output signal indication of an unbalanced condition of said network, said signal including a desired component and an undesired quadrature component, and including a primary side and a secondary side, a multistage amplifier having an input terminal and an output terminal, a connection to said input terminal from a point on said bridge impedance network, a motor having a control winding to which the output signal from said amplifier is supplied and a reference winding, and means operated by said motor to rebalance said bridge network, means for applying a signal from impedance circuits to the input terminal of the amplifier, a phase detector circuit connected to said output terminal for detecting the presence of the phase component of a signal in phase quadrature relation with respect to the input signal applied to the amplifier, a filter network to pass the positive portions of the detected signal, a diode detection network normally biased to a non-conductive state, and means for applying to the diode detection network the output of the filter network so that the diode detection network conducts in response to the detected signal.

References Cited by the Examiner

UNITED STATES PATENTS

| | | | |
|---|---|---|---|
| 2,786,183 | 3/1957 | Jacks | 318—28 |
| 3,045,156 | 7/1962 | Losher | 318—28 |
| 3,080,513 | 3/1963 | Edwards | 318—28 |
| 3,083,572 | 4/1963 | Pearson | 318—29 X |
| 3,135,901 | 6/1964 | Codier | 318—29 |

JOHN F. COUCH, *Primary Examiner.*